United States Patent
Sinha et al.

(10) Patent No.: US 12,087,774 B2
(45) Date of Patent: Sep. 10, 2024

(54) REDUCING BACK POWERING IN I/O CIRCUITS

(71) Applicant: TEXAS INSTRUMENTS INCORPORATED, Dallas, TX (US)

(72) Inventors: Madhuresh Sinha, Mughalsarai (IN); Subramanian Jagdish Narayan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 353 days.

(21) Appl. No.: 17/489,535

(22) Filed: Sep. 29, 2021

(65) Prior Publication Data

US 2023/0098179 A1    Mar. 30, 2023

(51) Int. Cl.
*H01L 27/092*    (2006.01)
*H01L 27/02*    (2006.01)

(52) U.S. Cl.
CPC ...... *H01L 27/0922* (2013.01); *H01L 27/0207* (2013.01)

(58) Field of Classification Search
CPC ............ H01L 27/0922; H01L 27/0207; H03K 19/018521; H03K 19/00315
See application file for complete search history.

(56) References Cited

U.S. PATENT DOCUMENTS

| | | | | |
|---|---|---|---|---|
| 6,335,653 B1* | 1/2002 | Shigehara | ............ | H03K 17/063 327/404 |
| 6,353,333 B1* | 3/2002 | Curd | ................ | H03K 19/00315 326/83 |
| 6,567,024 B1* | 5/2003 | Ishikawa | ............ | H03K 17/6874 257/370 |
| 6,861,874 B1* | 3/2005 | Chen | ................ | H03K 19/00315 326/83 |
| 7,180,331 B2* | 2/2007 | Gosmain | .......... | H03K 19/00315 326/86 |
| 7,239,176 B2* | 7/2007 | Gupta | .............. | H03K 19/00315 326/80 |
| 2011/0032021 A1* | 2/2011 | Dianbo | ................ | H03K 17/063 327/427 |
| 2016/0248418 A1* | 8/2016 | Chen | ................ | H03K 19/00361 |
| 2018/0191347 A1* | 7/2018 | Bonetti | .......... | H03K 19/018521 |

* cited by examiner

*Primary Examiner* — Karen Kusumakar
*Assistant Examiner* — Adam S Bowen
(74) *Attorney, Agent, or Firm* — Valerie M. Davis; Frank D. Cimino

(57) ABSTRACT

In examples, an input/output (I/O) circuit comprises an input, an output, and a first transistor having a first control terminal, a first current terminal and a second current terminal, the first current terminal coupled to the input. The circuit also includes a second transistor having a second control terminal, a third current terminal and a fourth current terminal, the third current terminal coupled to ground and the fourth current terminal coupled to the second current terminal. The circuit further includes a third transistor having a third control terminal, a fifth current terminal and a sixth current terminal, the third transistor coupled between the input and the output and the third control terminal coupled to the second current terminal.

17 Claims, 1 Drawing Sheet

REDUCING BACK POWERING IN I/O CIRCUITS

BACKGROUND

Electronic circuits may receive analog or digital signals as inputs. The inputs are received from control circuits or from some other source. The inputs cause the electronic circuits to perform certain functions. The electronic circuits provide signals responsive to the inputs.

SUMMARY

In examples, an input/output (I/O) circuit comprises an input, an output, and a first transistor having a first control terminal, a first current terminal and a second current terminal, the first current terminal coupled to the input. The circuit also includes a second transistor having a second control terminal, a third current terminal and a fourth current terminal, the third current terminal coupled to ground and the fourth current terminal coupled to the second current terminal. The circuit further includes a third transistor having a third control terminal, a fifth current terminal and a sixth current terminal, the third transistor coupled between the input and the output and the third control terminal coupled to the second current terminal.

BRIEF DESCRIPTION OF THE DRAWINGS

For a detailed description of various examples, reference will now be made to the accompanying drawings in which.

The same reference numbers or other reference designators are used in the drawings to designate the same or similar (functionally and/or structurally) features.

DETAILED DESCRIPTION

Figure 1:
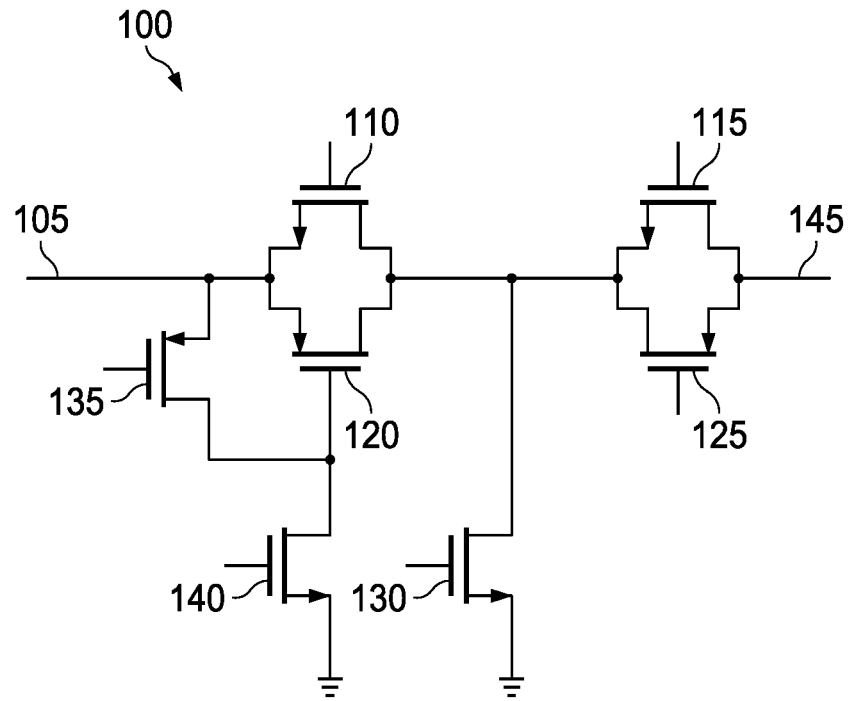
FIG. 1 is a circuit schematic diagram of an input/output (I/O) circuit in accordance with various examples.

Input/output (I/O) circuits are circuits that serve as an interface between: (i) a circuit (e.g., an analog circuit, a digital circuit and/or a logic circuit), device (e.g., a process, a microcontroller, a comparator, an amplifier and/or memory) or component; and (ii) a different circuit (e.g., an analog circuit, a digital circuit and/or a logic circuit), device (e.g., a process, a microcontroller, a comparator, an amplifier and/or memory) or component. For example, an I/O circuit may provide a proper interface for two components that are in different voltage domains (e.g., one component may operate at 3.3 V and the other operates as 5 V). I/O circuits may include a variety of components, such as transistors (e.g., field effect transistors (FETs)). For example, multiple transistors may be configured to produce a complementary metal-oxide-semiconductor (CMOS) switch or a pair of CMOS switches. The transistors in the CMOS switches may be selectively controlled to place the CMOS switches, and, thus, the I/O circuit, in an "on" (e.g., conducting) state or an "off" (e.g., non-conducting) state.

An example I/O circuit including a CMOS switch may have multiple operational drawbacks. For example, an input to the CMOS switch and a voltage supply provided to the CMOS switch may be coupled to a transistor in the CMOS switch in a configuration that will cause the transistor to undesirably conduct current when the voltage provided on the input to the CMOS switch exceeds the voltage supply. For instance, when: (i) the I/O circuit is off; (ii) the voltage supply to the CMOS switch is coupled to the gate of a p-channel metal-oxide-semiconductor field effect transistor (PMOS) switch; and (iii) the input to the CMOS switch is coupled to the source of the PMOS switch, the voltage at the source exceeds the voltage at the gate by at least a threshold voltage of the PMOS switch thereby turning on the PMOS switch. Thus, the PMOS switch leaks current to ground through the CMOS switch even though the I/O circuit is off. Such leakage current through the leaky PMOS switch may cause "loading" (also referred to as "back powering") of the input power source coupled to the I/O circuit. Loading of the input is undesirable because it may cause damage to the input source and may produce errors in voltage values provided by a controller coupled to the input of the I/O circuit.

In a first example I/O circuit, an n-channel metal-oxide-semiconductor field effect transistor (NMOS) and a resistor are added to the I/O circuit. This example remedies the problem with loading on the input when the I/O circuit is off, because the resistor ensures that when the I/O circuit is off, the source-to-gate voltage on the leaky PMOS switch (described above) is inadequate to turn on the leaky PMOS switch, regardless of the input voltage on the input of the I/O circuit. However, this first example solution introduces additional challenges when the I/O circuit is on. Specifically, the resistor of this first example solution leaks current to ground through the NMOS switch of this first example solution when the I/O circuit is on, thereby precluding the I/O circuit from efficiently and accurately transferring an input voltage at the input of the I/O circuit to the output of the I/O circuit. For example, a 1 mega-ohm (MΩ) resistor results in leakage current on the order of micro-amps (µA) when the I/O circuit is in the on state. A resistor with increased resistance may be used to reduce the leakage current. However, the larger resistor may be impractical for use in an integrated circuit (IC) package due to size limitations of the IC, and such size increases result in increased overall cost.

Described herein are various example embodiments of an I/O circuit topology to mitigate the challenges described above. More specifically, example I/O circuits mitigate leakage currents, input loading, and the inefficient transfer of voltages from I/O circuit input to I/O circuit output in both on and off conditions with the use of an NMOS switch, and a PMOS switch that replaces the resistor used in the first example solution. When an example I/O circuit is off, the PMOS switch turns on and ensures that the leaky PMOS switch described above does not conduct a leakage current to ground, even when conditions exist that would otherwise cause the leaky PMOS switch to conduct a leakage current to ground. Because little or no current is leaked in the off state, the input loading problem is mitigated, and the I/O circuit efficiently and accurately transfers voltages from the input of the I/O circuit to the output of the I/O circuit. Furthermore, when the I/O circuit is on, the NMOS switch is turned on, thereby pulling the gate of the leaky PMOS switch to ground and allowing the leaky PMOS switch to conduct current normally. The PMOS switch that replaces the resistor of the first example solution, however, is off, thereby preventing current from leaking to ground. In this way, this example I/O circuit mitigates current leakage (e.g., from a microampere scale to a sub-nanoampere scale), enables the proper transfer of voltages from I/O circuit input to I/O circuit output, and prevents input power source loading.

FIG. 1 is a circuit schematic of an I/O circuit 100 in accordance with various examples. I/O circuit 100 includes input 105, NMOS switches 110, 115, 130, and 140, PMOS switches 120, 125, and 135, and output 145. NMOS switch 110 and PMOS switch 120 form a CMOS switch, and NMOS switch 115 and PMOS switch 125 form a CMOS switch. Input 105 is coupled to the sources of NMOS switch 110 and PMOS switches 120 and 135. The drain of PMOS switch 120 is coupled to the drains of NMOS switches 110 and 130, the drain of PMOS switch 125, and the source of NMOS switch 115. The gate of PMOS switch 120 is coupled to the drain of PMOS switch 135 and the drain of NMOS switch 140. The sources of NMOS switches 130 and 140 are coupled to ground. Output 145 is coupled to the drain of NMOS switch 115 and the source of PMOS switch 125. The gates of NMOS switches 110, 115, 130, and 140 and the gates of PMOS switches 125 and 135 are coupled to a controller (not pictured in FIG. 1, but pictured in FIG. 2). The controller may be configured to selectively apply an analog supply voltage (e.g., approximately 1.8 V, 3.3 V or 5 V) and/or approximately ground (e.g., a voltage sufficiently less than a transistor threshold voltage) to the gates of the various switches in the I/O circuit 100 to control whether the I/O circuit 100 is in an on state or off state. The signals applied by the controller to enable the on state and off states of the I/O circuit 100 are described in greater detail below.

A first example I/O circuit as described above may include NMOS switches 110, 115, and 130 and PMOS switches 120 and 125. This first example I/O circuit does not include PMOS switch 135 and NMOS switch 140. This first example I/O circuit is in an on state responsive to an analog supply voltage being applied to the gates of switches 110 and 115, and ground being applied to the gates of switches 120, 125, and 130. This first example I/O circuit is in an off state responsive to the ground being applied to the gates of switches 110 and 115, and an analog supply voltage being applied to the gate of switches 120, 125, and 130. While in the off state, this first example I/O circuit may experience loading on the input 105 when the voltage on input 105 is greater than the analog supply voltage applied to the gates of PMOS switch 120 and NMOS switch 130. When the input voltage on input 105 is greater than the analog supply voltage applied to the gates of PMOS switch 120 and NMOS switch 130, PMOS switch 120 and NMOS switch 130 provide a path to ground for the input signal (e.g., a leakage current), resulting in loading of the input 105.

In a second example I/O circuit, to prevent loading of the input 105, NMOS switch 140 may added to the first example I/O circuit and a resistor (not pictured) is added between the input 105 and the gate of PMOS switch 120. Thus, the second example solution includes the resistor in the position where PMOS switch 135 is shown in FIG. 1. This second example solution is in an on state responsive to the analog supply voltage being applied to the gates of NMOS switches 110, 115, and 140 and ground being applied to the gate of PMOS switch 125 and NMOS switch 130. This second example solution is in an off state responsive to the analog supply voltage being applied to the gates of PMOS switch 125 and NMOS switch 130 and ground being applied to the gates of NMOS switches 110, 115, and 140. In the off state, the path to ground through NMOS switch 140 is removed, thus the gate voltage of PMOS switch 120 would equal the input voltage on the source of PMOS switch 120 turning off PMOS switch 120, thereby preventing current leakage through NMOS switch 140 and removing loading of the input 105. In the on state, NMOS switch 140 pulls down the gate of PMOS switch 120 to ground, ensuring the full range of the analog supply voltage may be passed from input 105 to output 145. However, in the on state, this second example solution is disadvantageous in that a leakage current flows through the resistor, through NMOS 140, to ground. The leakage current causes undesirable variations in the voltage at output 145.

According to the various example embodiments herein (such as I/O circuit 100), the resistor of the second example solution is replaced with PMOS switch 135. I/O circuit 100 is in an on state responsive to the analog supply voltage being applied to NMOS switches 110, 115, and 140 and PMOS switch 135, and ground being applied to PMOS switch 125 and NMOS switch 130. I/O circuit 100 is in an off state responsive to the analog supply voltage being applied to PMOS switch 125 and NMOS switch 130 and ground being applied to NMOS switches 110, 115, and 140 and PMOS switch 135. In the off state, PMOS switch 135 is on, thereby causing PMOS switch 120 to turn off because the gate and source of PMOS switch 120 are at the same voltage. Because the gate and source of PMOS switch 120 are at the same voltage, the Vsg of PMOS switch 120 is not adequate to turn on PMOS switch 120. Accordingly, there is no path for leakage current to flow to ground when I/O circuit 100 is in the off state, thereby preventing loading of input 105. PMOS switch 135 remains on as long as the voltage on input 105 is higher than ground by the threshold voltage of PMOS switch 135. A voltage on input 105 that is not sufficient to turn on PMOS switch 135 may turn off or keep off PMOS switch 135, but the leakage current in such cases is negligible because the voltage on input 105 itself is negligible.

When the I/O circuit 100 is in the on state, NMOS switch 140 is on and thus pulls down the gate of PMOS switch 120 to ground, while PMOS switch 135 is off and thus prevents current flow to ground from the input 105. PMOS switch 135 is off because the analog supply voltage on the gate of PMOS switch 135 exceeds the voltage on input 105. PMOS switch 120 is on because, as described, the gate of PMOS switch 120 is pulled to ground and the voltage on input 105 is typically adequately high relative to the gate of PMOS switch 120 to turn on PMOS switch 120 (in the event the voltage on input 105 is inadequate to turn on PMOS switch 120, no input voltage, or a negligible input voltage, needs to be provided from input 105 to output 145). Thus, the input voltage can be passed to the output 145 without significant loss or variation caused by leakage current. In I/O circuit 100, PMOS switch 135 and NMOS switch 140 are added to the first example I/O circuit to prevent loading of the input 105 and to accurately pass a full range of input voltages, up to the analog supply voltage of the I/O circuit 100, to the output 145. As described above, the first and second example solutions leaked current in the order of μA. The addition of PMOS switch 135 and NMOS switch 140 reduces the leakage current to the order of sub-nanoamperes (nA). The lower leakage current results in no significant errors in the controller output voltage. In examples, the NMOS switches in FIG. 1 may be replaced with PMOS switches, and the PMOS switches may be replaced with NMOS switches.

In an example embodiment, the gates of transistors 110, 115, 135 and 140 are connected and the gates of transistors 125 and 130 are connected. In this embodiment, input 105 is connected to output 145 when the gates of transistors 110, 115, 135 and 140 are connected to a supply voltage (e.g., approximately 1.8V, 3.3V or 5V) and the gates of transistors 125 and 130 are connected to a low-voltage (e.g., a voltage less than the threshold voltage to turn on the transistors, such as, ground). Conversely, the input 105 is disconnected from the output 145 when the gates of transistors 110, 115, 135 and 140 are connected to a low-voltage (e.g., a voltage less than the threshold voltage to turn on the transistors, such as, ground) and the gates of transistors 125 and 130 are connected to a supply voltage (e.g., approximately 1.8V, 3.3V or 5V).

Figure 2:
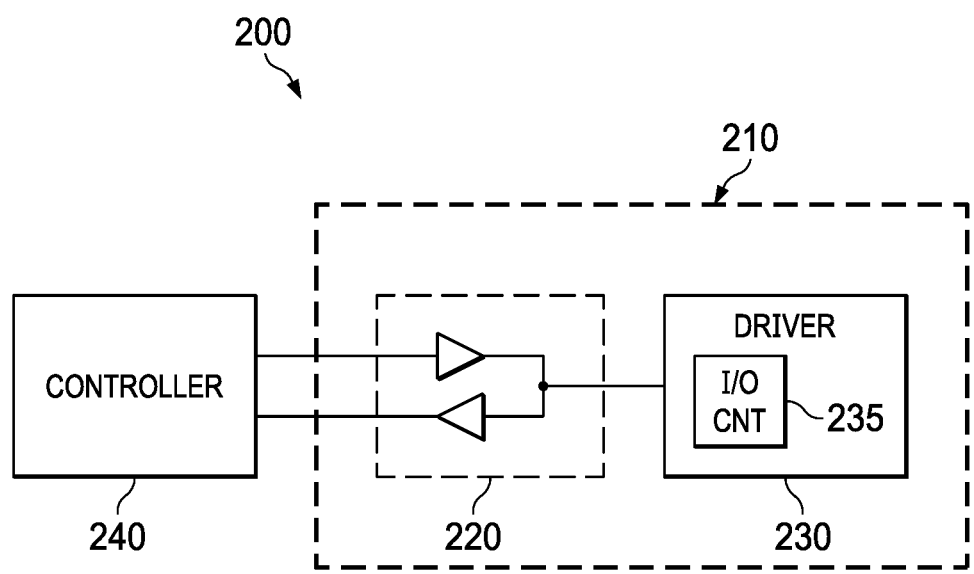
FIG. 2 is a block diagram of a control system in accordance with various examples.

FIG. 2 is a block diagram of a control system 200 in accordance with various examples. The control system 200 includes a driver integrated circuit (IC) 210 and a controller 240. The driver IC 210 includes an I/O circuit 220 and driver circuit 230. The I/O circuit 100 (FIG. 1) is an example of the I/O circuit 220. The driver circuit 230 may include various components for driving a device (e.g., a motor) coupled to the driver IC 210. The driver circuit 230 may also include an I/O controller 235 for controlling switches in the I/O circuit 220. For example, the I/O controller 235 may be coupled to the gates of the NMOS and PMOS switches shown in FIG. 1. The I/O controller 235 may be a discrete component or may be integrated with another controller in the driver IC 210 that also controls other components of the driver IC 210.

The controller 240 may be a microcontroller or other processor configured to provide an input signal (e.g., an input voltage) to the driver IC 210, such as on the input 105 shown in FIG. 1. An output of the I/O circuit 220, such as output 145 (FIG. 1), may be coupled to the driver circuit 230, thereby providing output signals (e.g., output voltages) to the driver circuit 230. In an alternative embodiment, I/O circuit 220 includes two (or more) I/O circuits 100. In this embodiment, one I/O circuit 100 has its input 105 coupled to controller 240 and its output 145 coupled to driver 230; and the other I/O circuit 100 may be connected similarly or with output 145 coupled to controller 240 and input 105 coupled to driver 230. This embodiment allows for bi-directional communications between controller 240 and driver 230. The I/O circuit 220 may be configured as an I/O buffer to provide a virtual isolation between controller 240 and the driver circuit 230. An I/O buffer provides flexibility in the input and output voltage and current capacities of the driver IC 210 and controller 240. For example, the controller 240 and the driver IC 210 may operate in different power supply domains, such that an input voltage provided by the controller 240 to the driver IC 210 may be different than an analog supply voltage of the driver IC 210. As described above, the input signal provided by the controller 240 to the driver IC 210 may be a greater voltage than the analog voltage of the driver IC 210. The I/O circuit 220 may function in a manner similar to I/O circuit 100 to prevent loading of the input from the controller 240 and to accurately pass the input voltage to the driver circuit 230.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. An input/output (I/O) circuit comprising:
   an input;
   an output;
   a first transistor having a first control terminal, a first current terminal and a second current terminal, the first current terminal coupled to the input;
   a second transistor having a second control terminal, a third current terminal and a fourth current terminal, the third current terminal coupled to ground and the fourth current terminal coupled to the second current terminal;
   a third transistor having a third control terminal, a fifth current terminal and a sixth current terminal, the third transistor coupled between the input and the output and the third control terminal coupled to the second current terminal;
   a fourth transistor coupled to the third transistor;
   a fifth transistor coupled to the input, the third transistor, and the fourth transistor;
   a sixth transistor coupled to the output, the third transistor, the fourth transistor, and the fifth transistor; and
   a seventh transistor coupled to the output, the third transistor, the fourth transistor, the fifth transistor, and the sixth transistor, wherein gates of the first transistor, the second transistor, the fifth transistor, and the sixth transistor are coupled.

2. The I/O circuit of claim 1, wherein the first transistor and the third transistor are p-channel metal oxide semiconductor (PMOS) switches, and wherein the second transistor is an n-channel metal oxide semiconductor (NMOS) switch.

3. The I/O circuit of claim 1, wherein the first transistor and the second transistor are configured to prevent loading of the input.

4. The I/O circuit of claim 1, wherein the fourth transistor, the fifth transistor, and the sixth transistor are NMOS switches, and wherein the seventh transistor is a PMOS switch.

5. An input/output (I/O) circuit, comprising:
   a first complementary metal-oxide-semiconductor (CMOS) switch coupled to an input of the I/O circuit;
   a second CMOS switch coupled between the first CMOS switch and an output of the I/O circuit;
   a first switch of a first channel type coupled between the first and second CMOS switches, the first switch coupled to ground;
   a second switch of the first channel type coupled between the first CMOS switch and ground; and
   a third switch of a second channel type coupled to the input, the first CMOS switch, and the second switch.

6. The I/O circuit of claim 5, wherein the first and second switches are n-channel metal oxide semiconductor (NMOS) switches, and wherein the third switch is a p-channel metal oxide semiconductor (PMOS) switch.

7. The I/O circuit of claim 6, wherein a drain of the first switch is coupled to the first and second CMOS switches and a source of the first switch is coupled to ground.

8. The I/O circuit of claim 6, wherein a source of the second switch is coupled to ground and a drain of the second switch is coupled to the first CMOS switch.

9. The I/O circuit of claim 8, wherein the drain of the second switch is coupled to a gate of a PMOS in the first CMOS switch.

10. The I/O circuit of claim 9, wherein a source of the third switch is coupled to the input of the I/O circuit and a drain of the third switch is coupled to the drain of the second switch and the gate of the PMOS in the first CMOS switch.

11. The I/O circuit of claim 10, wherein a gate of an NMOS switch in the first CMOS switch, a gate of an NMOS switch in the second CMOS switch, a gate of the second switch, and a gate of the third switch are configured to receive a same control signal.

12. The I/O circuit of claim 10, wherein a gate of a PMOS switch in the second CMOS switch and a gate of the first switch are configured to receive a same control signal.

13. An input/output (I/O) circuit, comprising:
   a first CMOS switch comprising an NMOS transistor and a PMOS transistor, wherein sources of the NMOS and PMOS transistors of the first CMOS switch are coupled to each other and to an input of the I/O circuit, and wherein drains of the NMOS and PMOS transistors of the first CMOS switch are coupled to each other;
   a second CMOS switch comprising an NMOS transistor and a PMOS transistor, a source of the NMOS transistor of the second CMOS switch coupled to a drain of the PMOS transistor in the second CMOS switch and to the drains of the NMOS and PMOS transistors of the first CMOS switch, a drain of the NMOS transistor of the second CMOS switch coupled to a source of the PMOS transistor in the second CMOS switch and to an output of the I/O circuit;
   a first NMOS transistor having a drain coupled to the first and second CMOS switches,
   wherein a source of the first NMOS transistor is coupled to a ground terminal;
   a second NMOS transistor coupled to a gate of the PMOS transistor in the first CMOS switch; and
   a first PMOS transistor coupled to the input of the I/O circuit and to the gate of the PMOS transistor in the first CMOS switch.

14. The I/O circuit of claim 13, wherein the drain of the first NMOS transistor is coupled to the drains of the NMOS and PMOS transistors in the first CMOS switch, to the source of the NMOS transistor in the second CMOS switch, and to the drain of the PMOS transistor in the second CMOS switch.

15. The I/O circuit of claim 13, wherein a drain of the second NMOS transistor is coupled to the gate of the PMOS transistor in the first CMOS switch, and wherein a source of the second NMOS transistor is coupled to ground.

16. The I/O circuit of claim 13, wherein a source of the first PMOS transistor is coupled to the input of the I/O circuit.

17. The I/O circuit of claim 13, wherein a drain of the first PMOS transistor is coupled to a gate of the PMOS transistor in the first CMOS switch and to a drain of the second NMOS transistor.

* * * * *